United States Patent
Jung

(10) Patent No.: US 11,049,776 B2
(45) Date of Patent: Jun. 29, 2021

(54) SEMICONDUCTOR MEMORY DEVICE HAVING CHIP-TO-CHIP BONDING STRUCTURE

(71) Applicant: SK hynix Inc., Icheon-si (KR)

(72) Inventor: Seung Ho Jung, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 16 days.

(21) Appl. No.: 16/724,006

(22) Filed: Dec. 20, 2019

(65) Prior Publication Data
US 2021/0066143 A1    Mar. 4, 2021

(30) Foreign Application Priority Data
Aug. 30, 2019  (KR) .................. 10-2019-0107213

(51) Int. Cl.
| | | |
|---|---|---|
| H01L 21/66 | (2006.01) | |
| H01L 23/00 | (2006.01) | |
| H01L 21/68 | (2006.01) | |
| G11C 16/06 | (2006.01) | |
| H01L 23/544 | (2006.01) | |

(52) U.S. Cl.
CPC ............. *H01L 22/30* (2013.01); *G11C 16/06* (2013.01); *H01L 21/68* (2013.01); *H01L 23/544* (2013.01); *H01L 24/95* (2013.01)

(58) Field of Classification Search
CPC .......... H01L 22/30; H01L 22/32; H01L 22/34
See application file for complete search history.

(56) References Cited

U.S. PATENT DOCUMENTS

| | | | |
|---|---|---|---|
| 2016/0268230 A1* | 9/2016 | Lin ...................... | H01L 23/291 |
| 2020/0006266 A1* | 1/2020 | Chen ...................... | H01L 25/04 |
| 2020/0381316 A1* | 12/2020 | Lee .................... | H01L 27/11582 |

FOREIGN PATENT DOCUMENTS

| | | |
|---|---|---|
| CN | 107658317 B | 1/2019 |
| KR | 10-2005-0075577 A | 7/2005 |

* cited by examiner

*Primary Examiner* — Jae Lee

(57) ABSTRACT

A semiconductor memory device includes a first chip having a first pad and a first misalignment detection pattern on a first surface; and a second chip having a second pad and a second misalignment detection pattern on a second surface, and bonded to the first surface of the first chip such that the second pad is coupled with the first pad. The second chip includes a misalignment detection circuit which is coupled between the second misalignment detection pattern and a test pad and outputs a first voltage provided from the first misalignment detection pattern, to the test pad, in the case where a misalignment between the first chip and the second chip exceeds a preset value such that the first misalignment detection pattern and the second misalignment detection pattern are shorted to each other.

19 Claims, 18 Drawing Sheets

SEMICONDUCTOR MEMORY DEVICE HAVING CHIP-TO-CHIP BONDING STRUCTURE

CROSS-REFERENCE TO RELATED APPLICATION

The present application claims priority under 35 U.S.C. § 119(a) to Korean Patent Application No. 10-2019-0107213 filed in the Korean Intellectual Property Office on Aug. 30, 2019, which is incorporated herein by reference in its entirety.

BACKGROUND

1. Technical Field

Various embodiments generally relate to a semiconductor memory device, and particularly, to a semiconductor memory device which has a chip-to-chip bonding structure.

2. Related Art

As a measure for reducing the size of a semiconductor memory device, a method is used in which a memory cell array and a logic circuit are fabricated on separate chips rather than being fabricated on a single chip, and are then bonded with each other.

SUMMARY

Various embodiments are directed to a semiconductor memory device capable of detecting a misalignment failure that occurs during the bonding of chips.

In an embodiment, a semiconductor memory device may include: a memory chip having a plurality of first pads and a first misalignment detection pattern on a first surface; and a circuit chip having a plurality of second pads and a second misalignment detection pattern on one surface, and bonded to the first surface of the memory chip such that the second pads are coupled with the first pads. The circuit chip may include a misalignment detection circuit which is coupled between the second misalignment detection pattern and a test pad and outputs a first voltage provided from the first misalignment detection pattern, to the test pad, in the case where a misalignment between the memory chip and the circuit chip exceeds a preset value such that the first misalignment detection pattern and the second misalignment detection pattern are shorted to each other.

In an embodiment, a semiconductor memory device may include: a first chip having a first pad and a first misalignment detection pattern on a first surface; and a second chip having a second pad and a second misalignment detection pattern on one surface, and bonded to the first surface of the first chip such that the second pad is coupled with the first pad. The second chip may include a misalignment detection circuit which is coupled between the second misalignment detection pattern and a test pad and outputs a first voltage provided from the first misalignment detection pattern, to the test pad, in the case where a misalignment between the first chip and the second chip exceeds a preset value such that the first misalignment detection pattern and the second misalignment detection pattern are shorted to each other.

DETAILED DESCRIPTION

Figure 1:
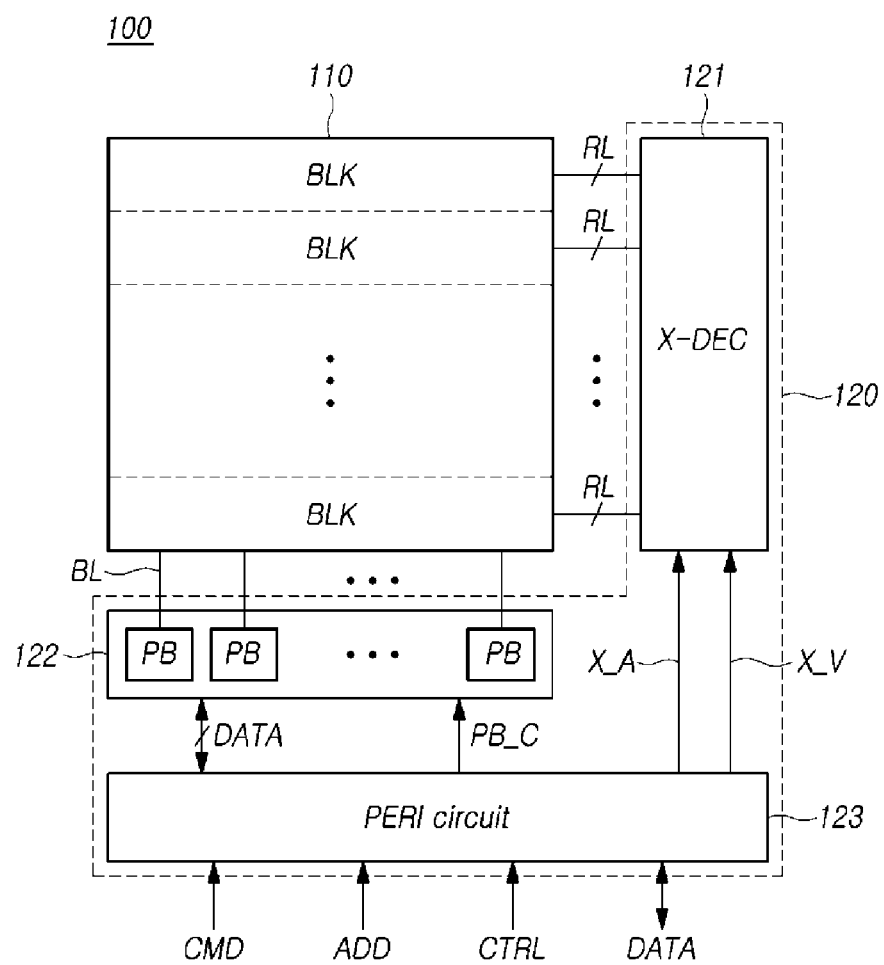
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not to imply or suggest the substances, order, sequence or number of the components. If a component is described as "connected," "coupled" or "linked" to another component, it may mean that the component is not only directly "connected," "coupled" or "linked" but also indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device having a chip-to-chip bonding structure will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of semiconductor memory device 100, it is to be understood that the technical spirit of the disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one, among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, that are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines, and the second direction SD may correspond to the extending direction of bit lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Figure 2:
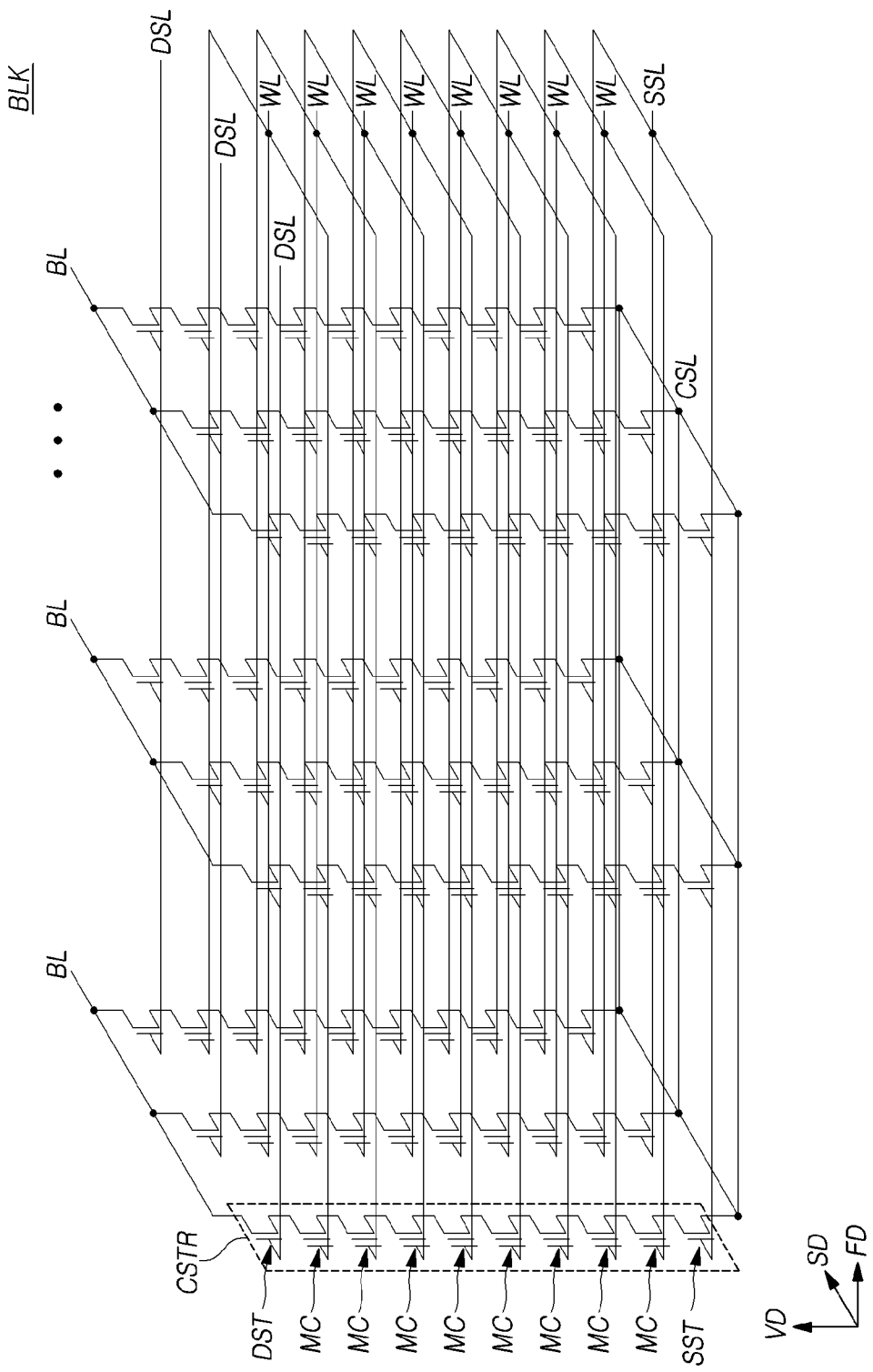
FIG. 2 is an equivalent circuit diagram illustrating an example of a memory blocks illustrated in FIG. 1 according to an embodiment of the disclosure.

FIG. 2 is an equivalent circuit diagram illustrating an example of one of the memory blocks BLK illustrated in FIG. 1 according to an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the vertical direction VD.

Drain select lines DSL, a plurality of word lines WL and a source select line SSL may be disposed between the bit lines BL and the common source line CSL in the vertical direction VD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

Figure 3:
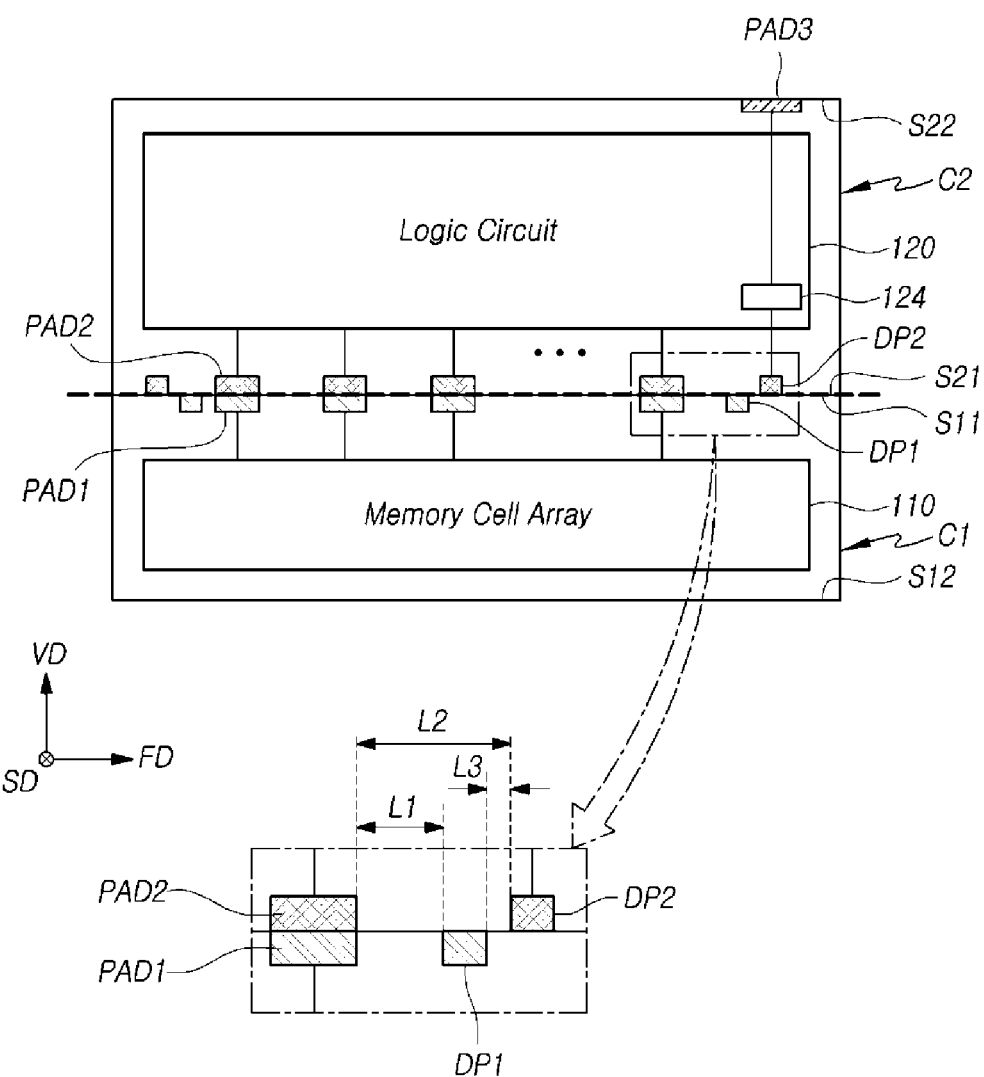
FIG. 3 is a cross-sectional view schematically illustrating an example of a semiconductor memory device in accordance with an embodiment of the disclosure.

FIG. 3 is a cross-sectional view schematically illustrating an example of a semiconductor memory device in accordance with an embodiment of the disclosure.

Referring to FIG. 3, a semiconductor memory device may include a memory chip C1 and a circuit chip C2. A memory cell array 110 may be defined in the memory chip C1. The memory chip C1 may have a first surface S11 and a second surface S12 which faces away from the first surface S11. The first surface S11 and the second surface S12 are substantially planar and substantially parallel to the FD-SD plane. A plurality of first pads PAD1 may be defined on the first surface S11 of the memory chip C1. The first pads PAD1 may be coupled with the memory cell array 110.

A logic circuit 120 may be defined in the circuit chip C2. As described above with reference to FIG. 1, the logic circuit 120 may include a row decoder, a page buffer circuit, and a peripheral circuit. The circuit chip C2 may have a first surface S21 and a second surface S22 which faces away from the first surface S21. First surface S21 and second surface S22 are substantially planar and substantially parallel to the FD-SD plane. A plurality of second pads PAD2 corresponding to the first pads PAD1 may be defined on the first surface S21 of the circuit chip C2. The second pads PAD2 may be coupled with the logic circuit 120.

A first pad PAD1 and a second pad PAD2 may correspond to each other and may have substantially the same size, and may be disposed symmetrically to each other in memory chip C1 and circuit C2, respectively. Similarly, a plurality of first pads PAD1 corresponding to a plurality of second pads PAD2 may have be symmetrical and mirror each other across the interface of first surface S11 and first surface S21. First surface S21 of the circuit chip C2 may be bonded onto the first surface S11 of the memory chip C1, and thereby, the first pads PAD1 and the second pads PAD2 corresponding to each other may be aligned and coupled with each other.

In the case where a misalignment occurs while the memory chip C1 and the circuit chip C2 are bonded with each other, a failure (hereinafter referred to as a 'misalignment failure') may be result. In a misalignment failure, first pads PAD1 and second pads PAD2 corresponding to each other are not coupled with each other, or the contact area between the first pads PAD1 and the second pads PAD2 corresponding to each other is reduced, which results in an excessively large resistance. In order to increase the reliability of a product, it is necessary to detect a misalignment failure, and to prevent a semiconductor memory device from being fabricated as a product when the semiconductor memory device is determined to have a misalignment failure. Embodiments of the disclosure may suggest a semiconductor memory device capable of detecting a misalignment failure.

A first misalignment detection pattern DP1 may be defined on the first surface S11 of the memory chip C1. The first misalignment detection pattern DP1 may be formed of a conductive material. The first misalignment detection pattern DP1 may be formed in the same process step as that used to form the first pads PAD1, and may be formed of the same material as the first pads PAD1. The first misalignment detection pattern DP1 may be coupled to a first voltage. In an embodiment, the first voltage may be a power supply voltage VCC. In another embodiment, the first voltage may be a ground voltage VSS.

A second misalignment detection pattern DP2 may be defined on the first surface S21 of the circuit chip C2. The second misalignment detection pattern DP2 may be formed of a conductive material. The second misalignment detection pattern DP2 and the second pads PAD2 may be formed in the same process step, and may be formed of the same material.

In the first direction FD, the interval between one of the first pads PAD1 and the first misalignment detection pattern DP1 may be defined as a first interval L1. The interval between a second pad PAD2, corresponding to the one first pad PAD1, and the second misalignment detection pattern DP2 may be defined as a second interval L2, and the second interval L2 may have a size different from the first interval L1. While the present embodiment illustrates a case in which the first interval L1 is smaller than the second interval L2, it is to be noted that, conversely, the first interval L1 may be larger than the second interval L2 in other embodiments.

FIG. 3 illustrates a state in which a misalignment has not occurred between the memory chip C1 and the circuit chip C2. If a misalignment has not occurred, then the interval between the first misalignment detection pattern DP1 and the second misalignment detection pattern DP2 may be defined as a third interval L3. The size of the third interval L3, as a value set at the time of chip design, may have the same or less than the margin for overlap between the first pads PAD1 and the second pads PAD2.

If the size of a misalignment between the memory chip C1 and the circuit chip C2 is smaller than the third interval L3, then the first misalignment detection pattern DP1 and the second misalignment detection pattern DP2 will not be shorted to each other. On the other hand, if the size of a misalignment between the memory chip C1 and the circuit chip C2 is equal to or larger than the third interval L3, then the first misalignment detection pattern DP1 and the second misalignment detection pattern DP2 will be shorted to each other.

A misalignment detection circuit 124 and a test pad PAD3 may be defined in the circuit chip C2. The misalignment detection circuit 124 may be coupled between the second misalignment detection pattern DP2 and the test pad PAD3. Although the example illustrates a case in which the test pad PAD3 is disposed at or near the second surface S22 of the circuit chip C2, it is to be noted that the position of the test pad PAD3 is not limited thereto.

Figure 4:
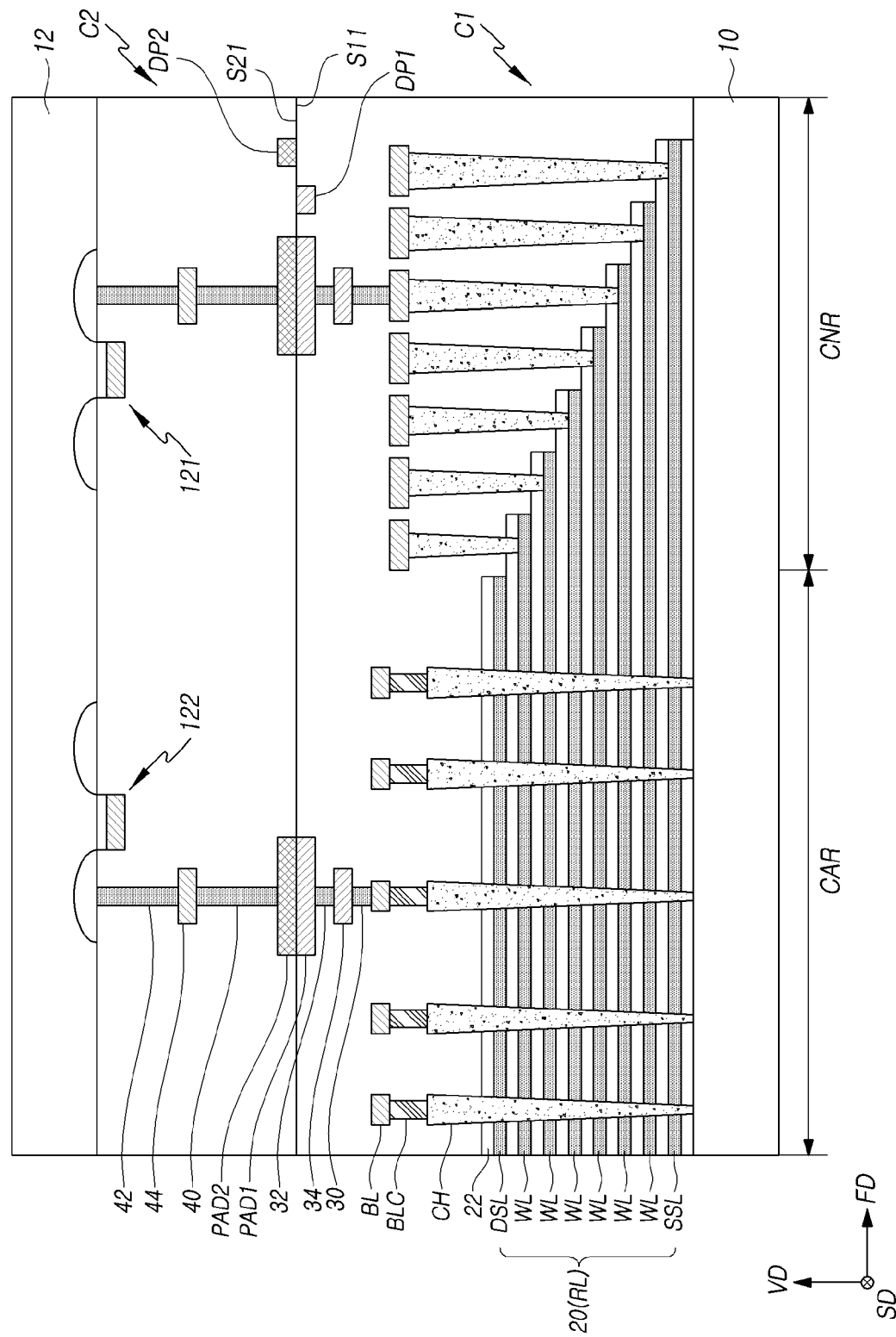
FIG. 4 is a cross-sectional view illustrating an example of a semiconductor memory device in accordance with an embodiment of the disclosure.

FIG. 4 is a cross-sectional view illustrating an example of a semiconductor memory device in accordance with an embodiment of the disclosure.

Referring to FIG. 4, the memory chip C1 may include a plurality of conductive layers 20 and a plurality of interlayer dielectric layers 22 which are alternately stacked on a first substrate 10. The conductive layers 20 may have a plate shape and may extend in the first direction FD and the second direction SD. The conductive layers 20 may extend from a cell area CAR to different end points in a coupling area CNR, thereby forming a step structure in the coupling area CNR. The conductive layers 20 may constitute row lines RL. In an example, the lowermost layer among the conductive layers 20 may constitute a source select line SSL, and the uppermost layer among the conductive layers 20 may constitute a drain select line DSL. The conductive layers 20 between the source select line SSL and the drain select line DSL may constitute word lines WL.

A plurality of vertical channels CH which pass through the conductive layers 20 and the interlayer dielectric layers 22 may be provided. Bit lines BL may be disposed over the vertical channels CH. The bit lines BL may extend in the second direction SD, and may be disposed and spaced apart in the first direction FD. The bit lines BL may be coupled with the vertical channels CH through bit line contacts BLC. While not illustrated, each of the vertical channels CH may include a channel layer and a gate dielectric layer. The channel layer may include polysilicon or monocrystalline silicon, and may include a P-type impurity such as boron (B) in some areas. The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked from the outer wall of the channel layer in an inward direction. In some embodiments, the gate dielectric layer may have an ONO (oxide-nitride-oxide) stack structure in which an oxide layer, a nitride layer and an oxide layer are sequentially stacked. Source select transistors may be formed in the region in which the source select line SSL surrounds the vertical channels CH. Memory cells may be formed in the region in which the word lines WL surround the vertical channels CH. Drain select transistors may be formed in the region in which the drain select line DSL surrounds the vertical channels CH.

The circuit chip C2 may include a row decoder 121 and a page buffer circuit 122, which are defined on a second substrate 12. FIG. 4 illustrates a case where the row lines RL and the bit lines BL defined in the memory chip C1 are coupled to the row decoder 121 and the page buffer circuit 122 defined in the circuit chip C2. Each of the first pads PAD1 defined at the first surface S11 of the memory chip C1 may be coupled to one of the bit lines BL and the row lines RL through contacts 30 and 32 and a wiring line 34. Each of the second pads PAD2 defined at the first surface S21 of the circuit chip C2 may be coupled to one of the row decoder 121 and the page buffer circuit 122 through contacts 40 and 42 and a wiring line 44.

Figure 5:
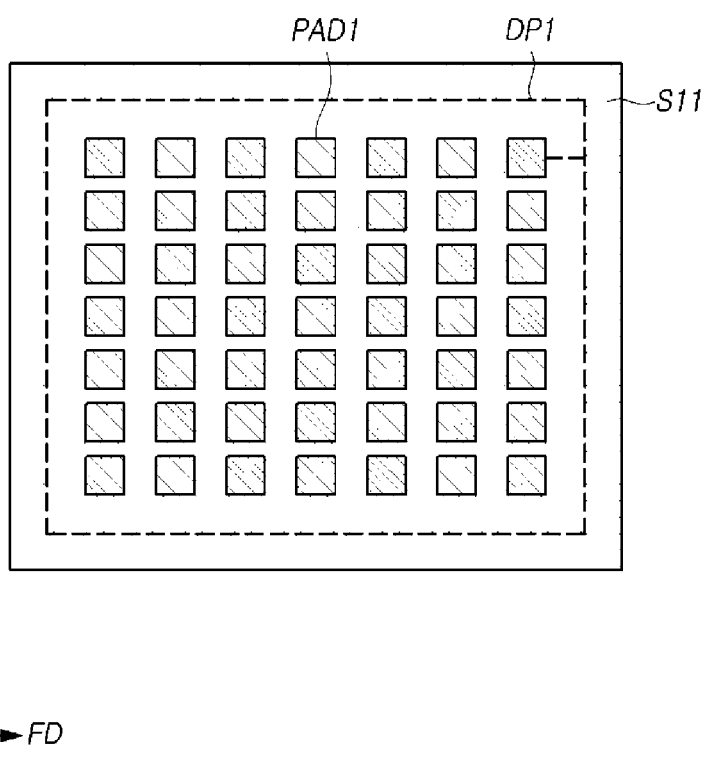
FIG. 5 is a diagram illustrating an example of a memory chip included in an embodiment of the disclosure.

FIG. 5 is a diagram illustrating an example of the memory chip C1 included in an embodiment of the disclosure.

Referring to FIG. 5, the first pads PAD1 may be disposed in the first direction FD and the second direction SD on the first surface S11 of the memory chip C1. The first misalignment detection pattern DP1 may be disposed at the edge of the first at or near surface S11 of the memory chip C1. In FIG. 5, the first misalignment detection pattern DP1 may be provided in the form of a closed loop that surrounds the first pads PAD1. The first misalignment detection pattern DP1 may be coupled to one of the first pads PAD1, and thereby, may be provided with a first voltage from the first pad PAD1.

Figure 6:
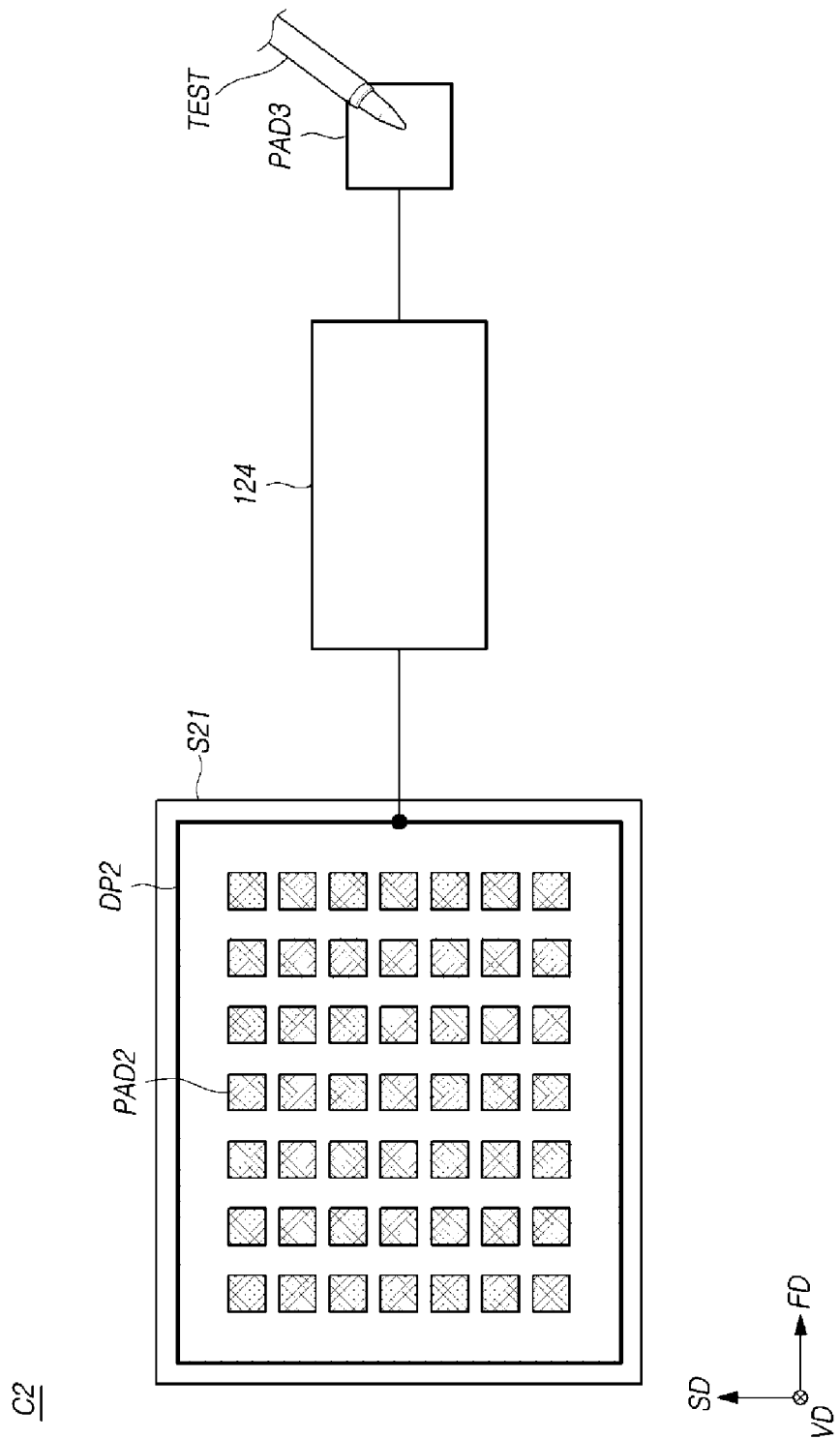
FIG. 6 is a diagram illustrating an example of a circuit chip included in an embodiment of the disclosure.

FIG. 6 is a diagram illustrating an example of the circuit chip C2 included in an embodiment of the disclosure.

Referring to FIG. 6, the second pads PAD2 may be disposed in the first direction FD and the second direction SD on or near the first surface S21 of the circuit chip C2. The second misalignment detection pattern DP2 may be disposed at the edge of the first surface S21 of the circuit chip C2. The second misalignment detection pattern DP2 may be provided in the form of a closed loop that surrounds the second pads PAD2. The second misalignment detection pattern DP2 may not be coupled to the second pads PAD2. The second misalignment detection pattern DP2 may be coupled to the misalignment detection circuit 124. The misalignment detection circuit 124 may be coupled between the second misalignment detection pattern DP2 and the test pad PAD3. A probe tip or a probe needle of test equipment TEST may come into contact with the test pad PAD3 during a test process. The test equipment TEST may detect a signal level of the test pad PAD3, and may determine a misalignment failure based on a detection result. For example, in a test process, the test equipment TEST may detect a signal level of the test pad PAD3, may determine that no misalignment failure has occurred when there is no change in a detected signal level. The test process may also determine that a misalignment failure has occurred when there is a change in a detected signal level.

Figure 7:
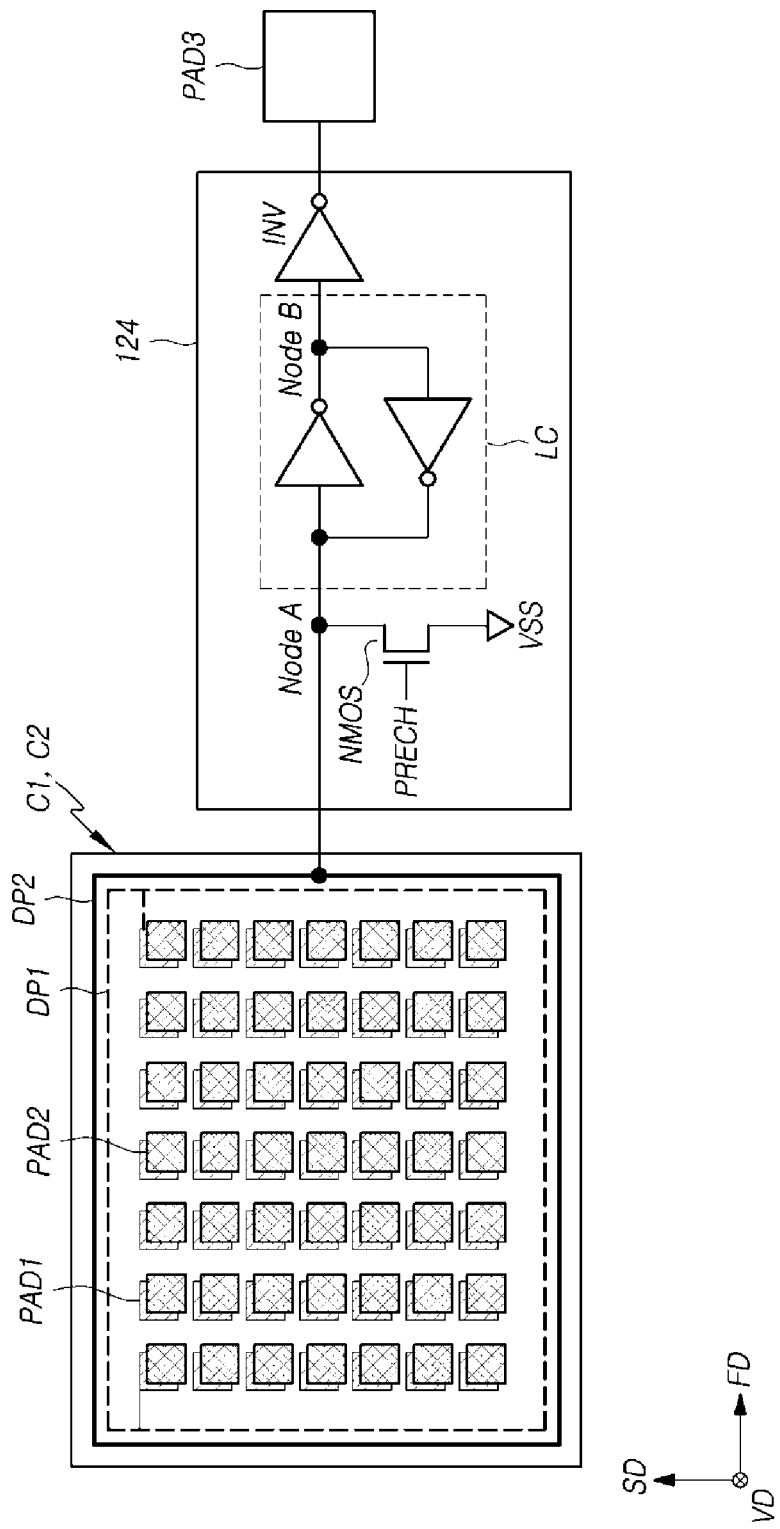
FIG. 7 is a diagram illustrating an example of a state in which no misalignment failure occurs in a semiconductor memory device in accordance with an embodiment of the disclosure.
Figure 8:
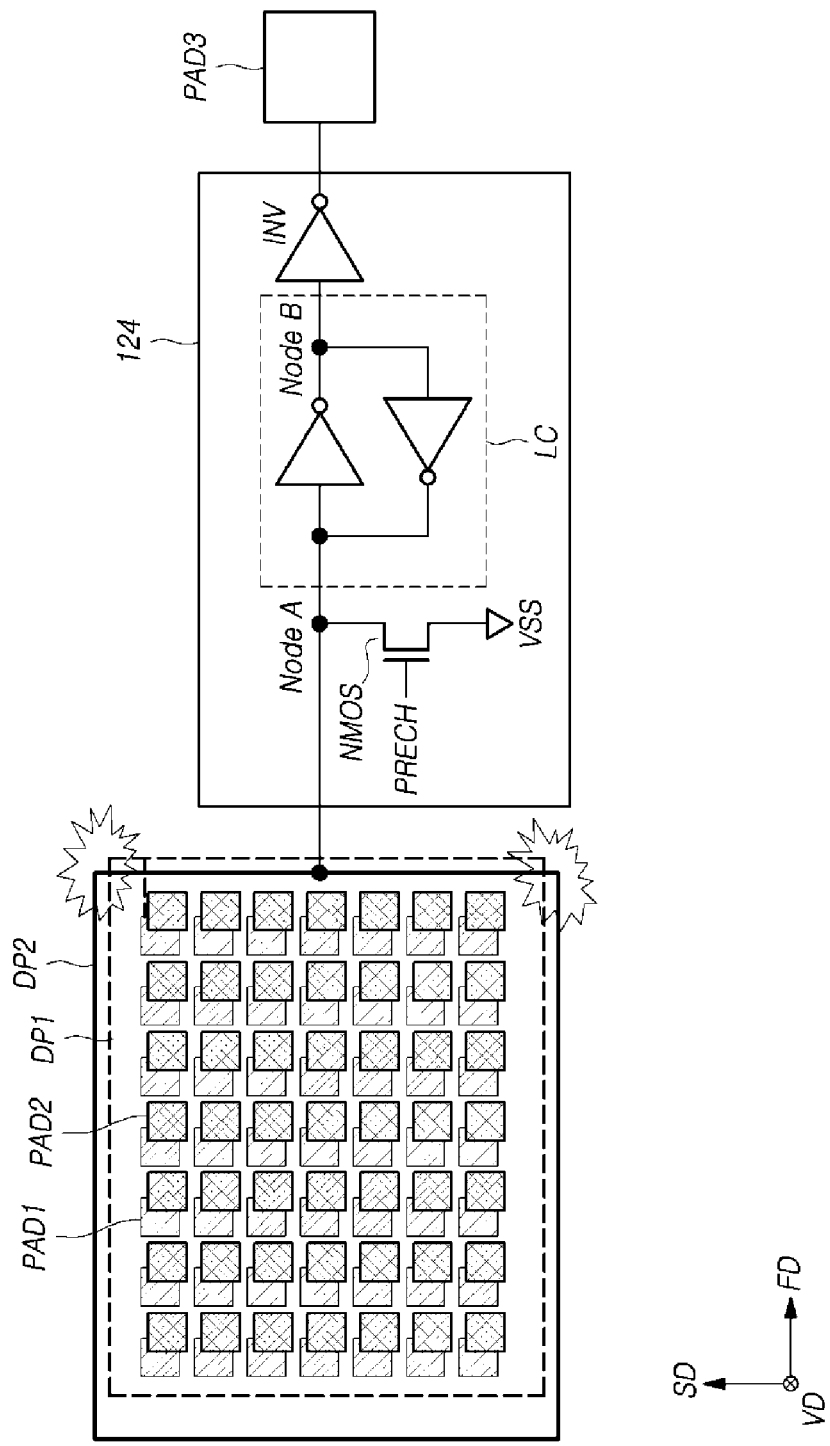
FIG. 8 is a diagram illustrating an example of a state in which a misalignment failure occurs in a semiconductor memory device in accordance with an embodiment of the disclosure.
Figure 9:
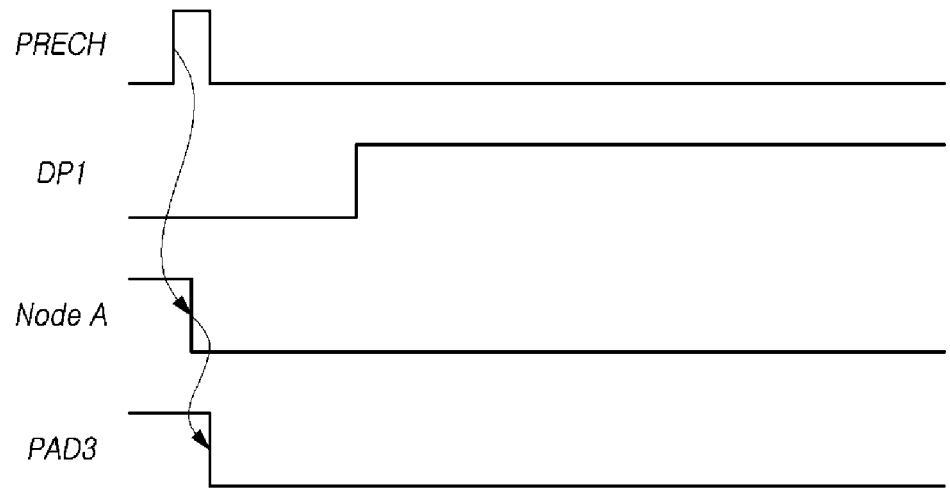
FIG. 9 is a waveform diagram illustrating an example of signals of main nodes in FIG. 7 in accordance with an embodiment of the disclosure.
Figure 10:
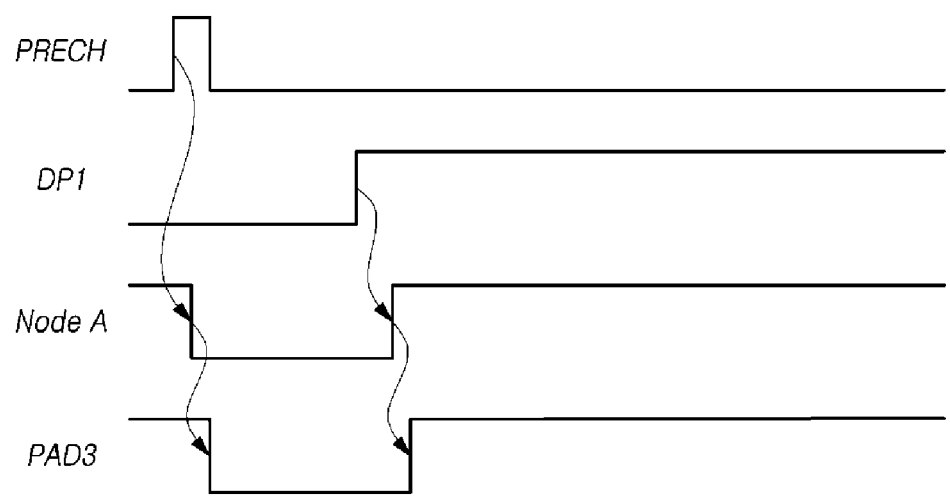
FIG. 10 is a waveform diagram illustrating an example of signals of main nodes in FIG. 8 in accordance with an embodiment of the disclosure.

FIG. 7 is a diagram illustrating an example of a state in which no misalignment failure occurs in a semiconductor memory device in accordance with an embodiment of the disclosure. FIG. 8 is a diagram illustrating an example of a state in which a misalignment failure occurs in a semiconductor memory device in accordance with an embodiment of the disclosure. FIG. 9 is a waveform diagram illustrating an example of signals of main nodes in FIG. 7. FIG. 10 is a waveform diagram illustrating an example of signals of main nodes in FIG. 8.

Referring to FIGS. 7 and 8, the misalignment detection circuit 124 may include a precharge circuit NMOS, a latch LC and an inverter INV.

The precharge circuit NMOS may include an NMOS transistor which is coupled between a node A (Node A) and the ground voltage VSS, and operates in response to a test enable signal PRECH. If the test enable signal PRECH is activated, then the precharge circuit NMOS may couple the node A (Node A) and the ground voltage VSS. If the test enable signal PRECH is deactivated, then the precharge circuit NMOS may decouple the node A (Node A) and the ground voltage VSS. The latch LC may perform a latch based on the voltage of the node A (Node A). The latch LC may apply a voltage to a node B (Node B) based on a signal stored therein. The inverter INV may invert the voltage applied to the node B (Node B), and may transfer the inverted voltage to the test pad PAD3. In an embodiment, the first misalignment detection pattern DP1 may be coupled with a power supply voltage (VCC) pad among the first pads PAD1.

FIG. 7 illustrates a case in which the size of a misalignment between the memory chip C1 and the circuit chip C2 is smaller than the third interval L3 (see FIG. 3), i.e., smaller than the acceptable margin of overlap. In this case, the first misalignment detection pattern DP1 of the memory chip C1 and the second misalignment detection pattern DP2 of the circuit chip C2 will not be shorted to each other.

Referring to FIGS. 7 and 9, in a misalignment test, the test enable signal PRECH may be transitioned (activated) from a low level to a high level. If the test enables signal PRECH transitions to a high level, then the NMOS transistor constituting the precharge circuit NMOS may be turned on and apply the ground voltage VSS to the node A (Node A). The ground voltage VSS applied to the node A (Node A) may be transferred to the test pad PAD3 through the misalignment detection circuit 124 so that a signal of the test pad PAD3 becomes a logic low L.

Thereafter, the power supply voltage VCC may be applied to the first misalignment detection pattern DP1. Because the first misalignment detection pattern DP1 of the memory chip C1 and the second misalignment detection pattern DP2 of the circuit chip C2 are in a state in which they are not shorted to each other, the potential of the second misalignment detection pattern DP2 and the node A (Node A) may be maintained at the ground voltage VSS, and the signal of the test pad PAD3 may be maintained at a logic low L. The test equipment TEST may detect that the signal of the test pad PAD3 has not changed, which corresponds to an absence of misalignment failure as the test result.

FIG. 8 illustrates a case in which the size of a misalignment between the memory chip C1 and the circuit chip C2 is larger than the third interval L3 (see FIG. 3). In this case, the first misalignment detection pattern DP1 of the memory chip C1 and the second misalignment detection pattern DP2 of the circuit chip C2 will be shorted to each other.

Referring to FIGS. 8 and 10, in a misalignment test, the test enable signal PRECH may be transitioned (activated) from a low level to a high level. If the test enables signal PRECH transitions to a high level, then the NMOS transistor constituting the precharge circuit NMOS may be turned on and apply the ground voltage VSS to the node A (Node A). The ground voltage VSS applied to the node A (Node A) may be transferred to the test pad PAD3 through the misalignment detection circuit 124 so that the signal of the test pad PAD3 becomes a logic low L.

Thereafter, the power supply voltage VCC may be applied to the first misalignment detection pattern DP1. Because the first misalignment detection pattern DP1 of the memory chip C1 and the second misalignment detection pattern DP2 of the circuit chip C2 are in a state in which they are shorted to each other, the potential of the second misalignment detection pattern DP2 and the node A (Node A) may be changed from the ground voltage VSS to the power supply voltage VCC, and the signal of the test pad PAD3 may be changed from a logic low L to a logic high H. The test equipment TEST may detect that the signal of the test pad PAD3 has changed, and may determine based on this detection result that a misalignment failure has occurred.

Figure 11:
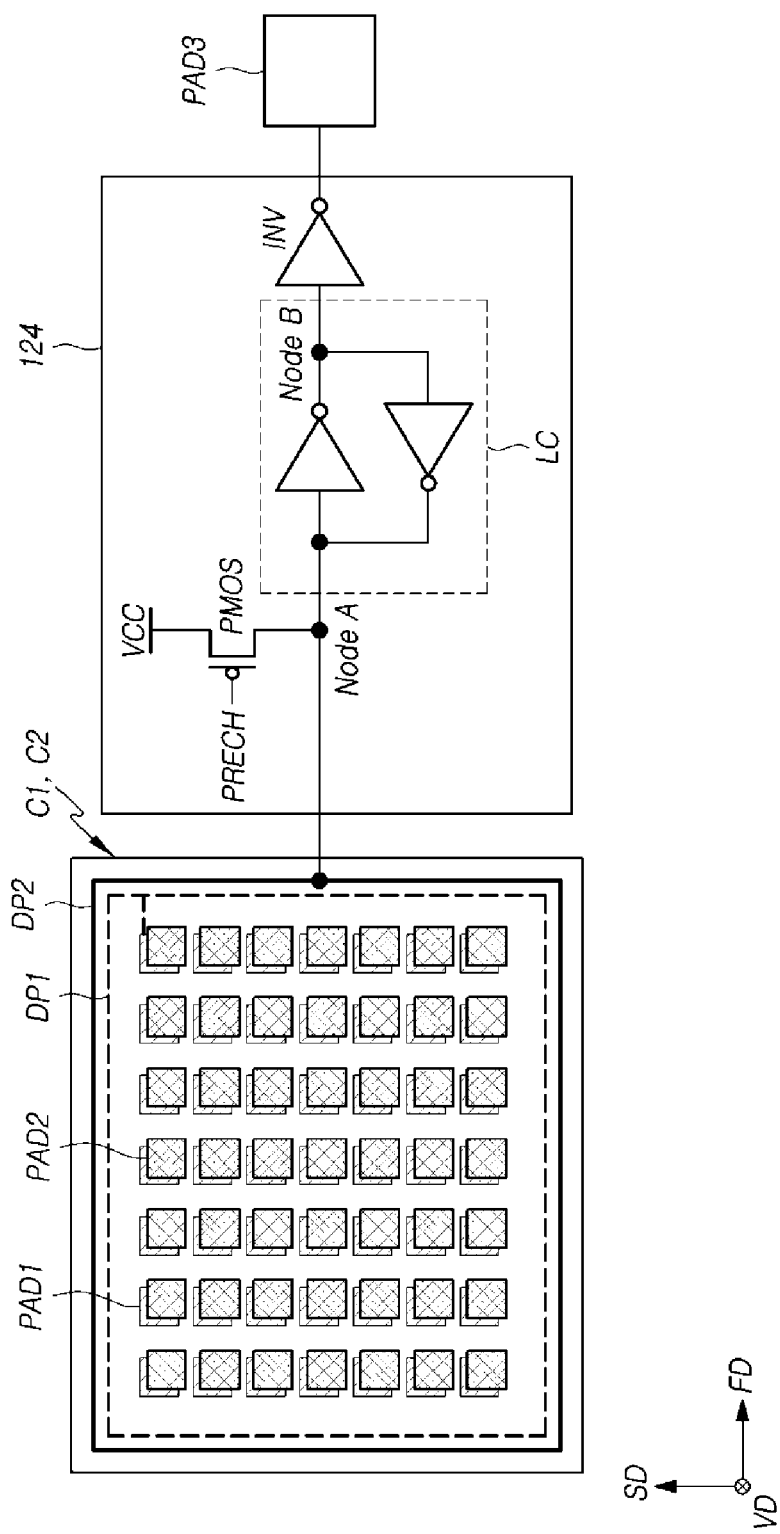
FIG. 11 is a diagram illustrating an example of a state in which no misalignment failure occurs in a semiconductor memory device in accordance with an embodiment of the disclosure.
Figure 12:
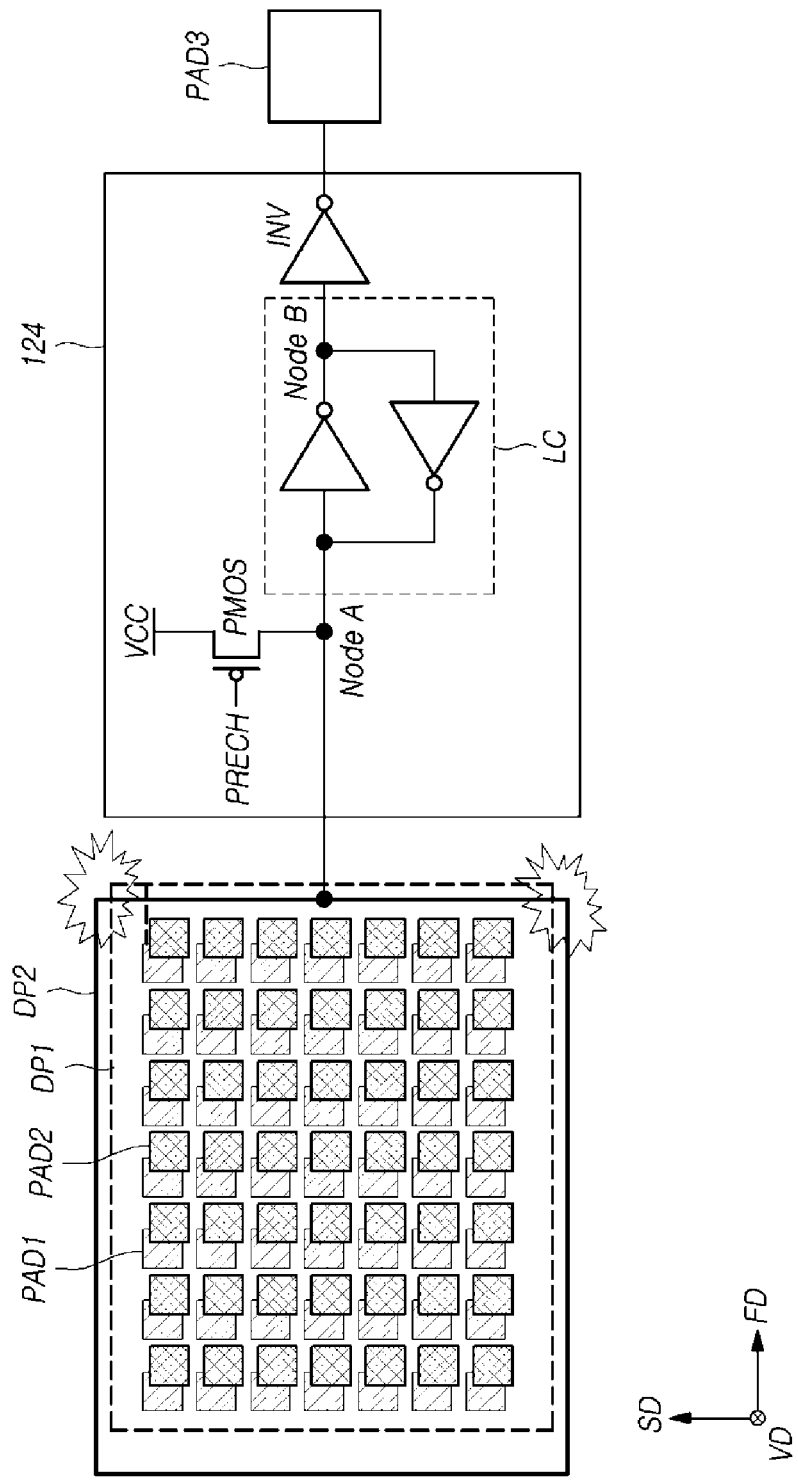
FIG. 12 is a diagram illustrating an example of a state in which a misalignment failure occurs in a semiconductor memory device in accordance with an embodiment of the disclosure.
Figure 13:
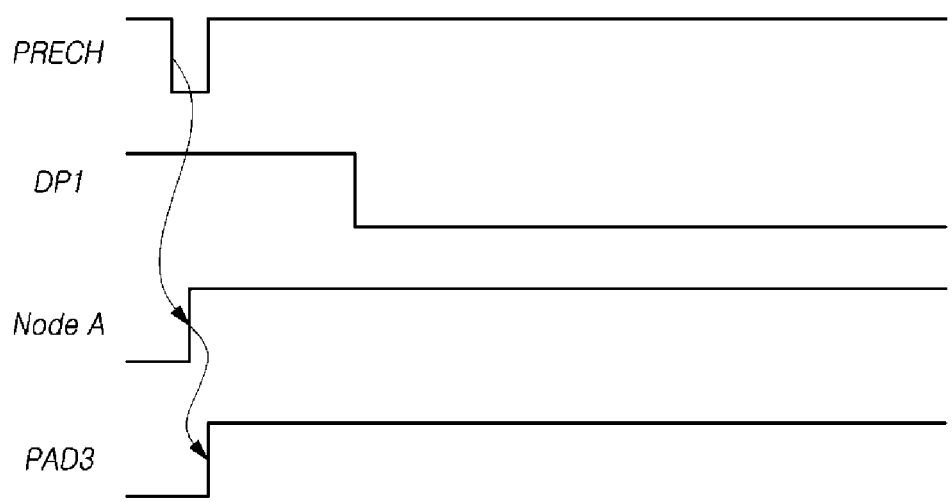
FIG. 13 is a waveform diagram illustrating an example of signals of main nodes in FIG. 11 in accordance with an embodiment of the disclosure.
Figure 14:
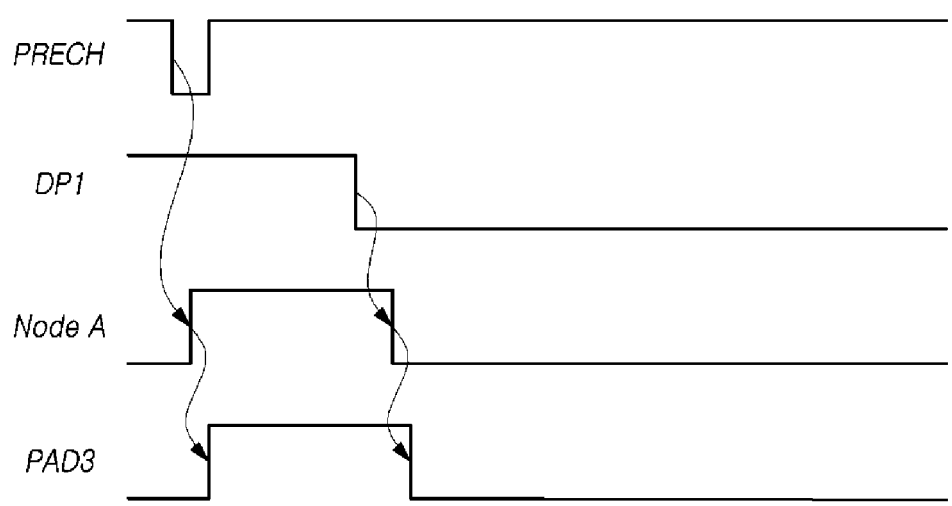
FIG. 14 is a waveform diagram illustrating an example of signals of main nodes in FIG. 12 in accordance with an embodiment of the disclosure.

FIG. 11 is a diagram illustrating an example of a state in which no misalignment failure occurs in a semiconductor memory device in accordance with an embodiment of the disclosure. FIG. 12 is a diagram illustrating an example of a state in which a misalignment failure occurs in a semiconductor memory device in accordance with another embodiment of the disclosure. FIG. 13 is a waveform diagram illustrating an example of signals of main nodes in FIG. 11. FIG. 14 is a waveform diagram illustrating an example of signals of main nodes in FIG. 12.

Referring to FIGS. 11 and 12, the misalignment detection circuit 124 may include a precharge circuit PMOS, a latch LC and an inverter INV.

The precharge circuit PMOS may include a PMOS transistor which is coupled between the power supply voltage VCC and a node A (Node A), and operates in response to a test enable signal PRECH. If the test enable signal PRECH is activated, then the precharge circuit PMOS may couple the node A (Node A) and the power supply voltage VCC. If the test enable signal PRECH is deactivated, then the precharge circuit PMOS may decouple the node A (Node A) and the power supply voltage VCC. The latch LC may perform a latch based on the voltage of the node A (Node A). The latch LC may apply a voltage to a node B (Node B) based on a signal stored therein. The inverter INV may invert the voltage applied to the node B (Node B), and may transfer the inverted voltage to the test pad PAD3. In an embodiment, the first misalignment detection pattern DP1 may be coupled with a ground voltage (VSS) pad among the first pads PAD1.

FIG. 11 illustrates a case in which the size of a misalignment between the memory chip C1 and the circuit chip C2 is smaller than the third interval L3 (see FIG. 3), i.e., smaller than the acceptable margin of overlap. In this case, the first misalignment detection pattern DP1 of the memory chip C1 and the second misalignment detection pattern DP2 of the circuit chip C2 will not be shorted to each other.

Referring to FIGS. 11 and 13, in a misalignment test, the test enable signal PRECH may be transitioned (activated) from a high level to a low level. If the test enable signal PRECH transitions to a low level, then the PMOS transistor constituting the precharge circuit PMOS may be turned on to apply the power supply voltage VCC to the node A (Node A). The power supply voltage VCC applied to the node A (Node A) may be transferred to the test pad PAD3 through the misalignment detection circuit 124 so that the signal of the test pad PAD3 becomes a logic high H.

Thereafter, the ground voltage VSS may be applied to the first misalignment detection pattern DP1. Because the first misalignment detection pattern DP1 of the memory chip C1 and the second misalignment detection pattern DP2 of the circuit chip C2 are in a state in which they are not shorted to each other, the potential of the second misalignment detection pattern DP2 and the node A (Node A) may be maintained at the power supply voltage VCC, and the signal of the test pad PAD3 may be maintained at a logic high H. The test equipment TEST may detect that the signal of the test pad PAD3 has not changed, and may determine based on this detection result that no misalignment failure has occurred.

FIG. 12 illustrates a case in which the size of a misalignment between the memory chip C1 and the circuit chip C2 is larger than the third interval L3 (see FIG. 3). In this case, the first misalignment detection pattern DP1 of the memory chip C1 and the second misalignment detection pattern DP2 of the circuit chip C2 will be shorted to each other.

Referring to FIGS. 12 and 14, in a misalignment test, the test enable signal PRECH may be transitioned (activated) from a high level to a low level. If the test enables signal PRECH transitions to a low level, then the PMOS transistor constituting the precharge circuit PMOS may be turned on to apply the power supply voltage VCC to the node A (Node A). The power supply voltage VCC applied to the node A (Node A) may be transferred to the test pad PAD3 through the misalignment detection circuit 124 so that the signal of the test pad PAD3 becomes a logic high H.

Thereafter, the ground voltage VSS may be applied to the first misalignment detection pattern DP1. Since the first misalignment detection pattern DP1 of the memory chip C1 and the second misalignment detection pattern DP2 of the circuit chip C2 are in a state in which they are shorted to each other, the potential of the second misalignment detection pattern DP2 and the node A (Node A) may be changed from the power supply voltage VCC to the ground voltage VSS, and the signal of the test pad PAD3 may be changed from a logic high H to a logic low L. The test equipment TEST may detect that the signal of the test pad PAD3 has changed, and may determine based on this detection result that a misalignment failure has occurred.

The above-described embodiments illustrate cases in which the first and second misalignment detection patterns DP1 and DP2 have a closed-loop shape, but it is to be noted that the shape of the first and second misalignment detection patterns DP1 and DP2 is not limited thereto.

Figure 15:
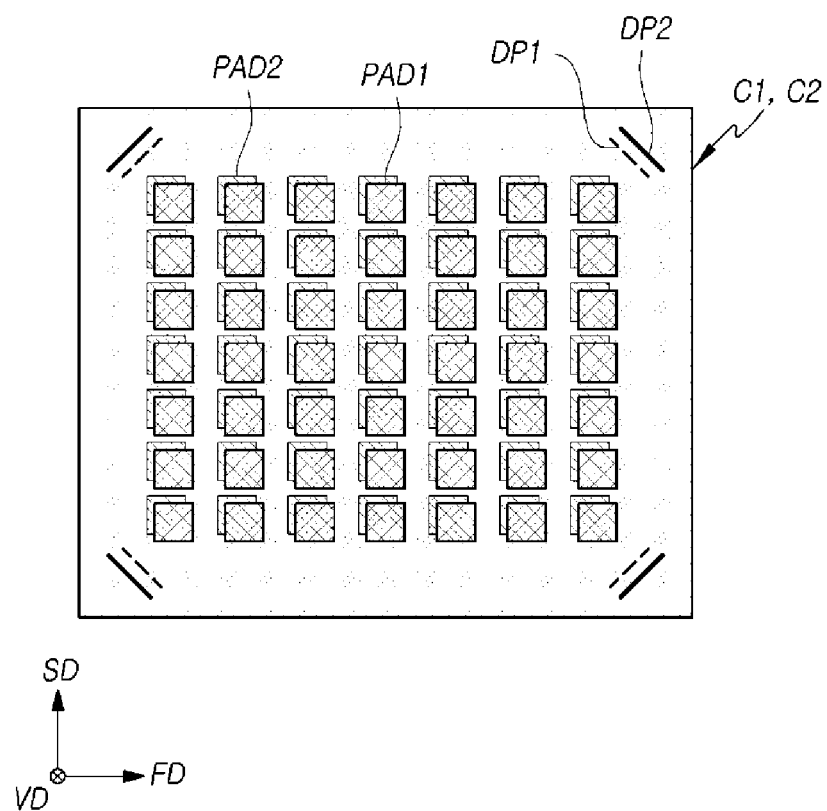
FIGS. 15 and 16 are diagrams illustrating examples of modifications of first and second misalignment detection patterns in accordance with an embodiment of the disclosure.
Figure 16:
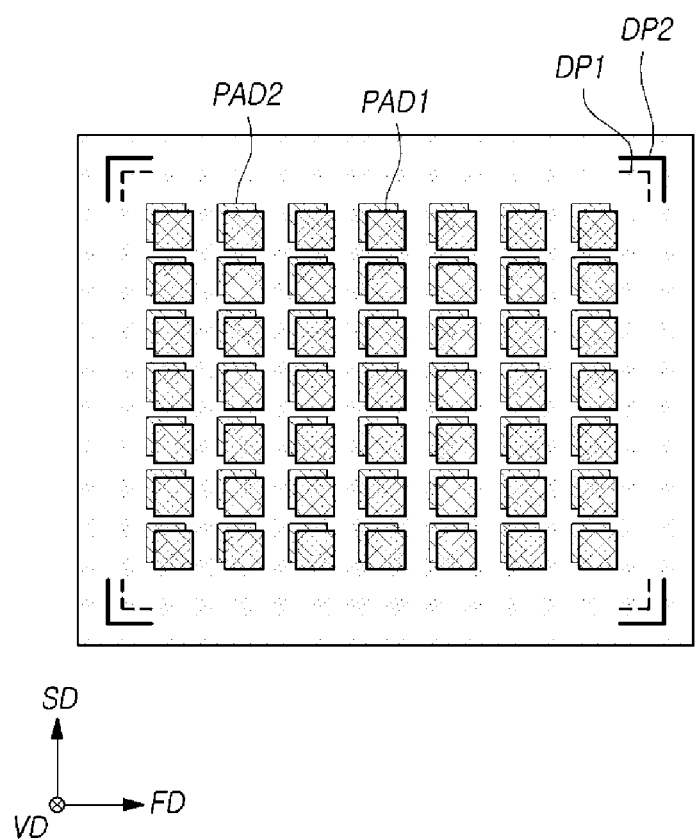

FIGS. 15 and 16 are diagrams illustrating examples of modifications of first and second misalignment detection patterns DP1 and DP2.

Referring to FIGS. 15 and 16, the first and second misalignment detection patterns DP1 and DP2 may be locally disposed at edge corners of the memory chip C1 and the circuit chip C2. In this example, the first and second misalignment detection patterns DP1 and DP2 are locally disposed, and layout area consumption due to the first and second misalignment detection patterns DP1 and DP2 may be reduced.

The first and second misalignment detection patterns DP1 and DP2 may have various shapes at the edge corners. The first and second misalignment detection patterns DP1 and DP2 may have a line shape as illustrated in FIG. 15, or may have a structure bent into an L-shape as illustrated in FIG. 16.

While the above-described embodiments illustrate a case in which chips to be bonded with each other are a memory chip C1 and a circuit chip C2, it is to be noted that the types of chips contemplated by this disclosure are not limited thereto.

According to the embodiments of the disclosure, when a misalignment failure occurs during bonding of chips, because the misalignment failure may be detected, it is possible to prevent a semiconductor memory device having such a failure from being fabricated as a product, whereby the reliability of a product and its manufacturing process may be improved. In addition, because a misalignment failure may be easily detected by a simple task of checking the signal level of a test pad, the time and effort required to detect a misalignment failure may be reduced. Moreover, since expensive equipment, such as optical equipment, is not required for misalignment failure detection, it is possible to contribute to the reduction in manufacturing costs.

Figure 17:
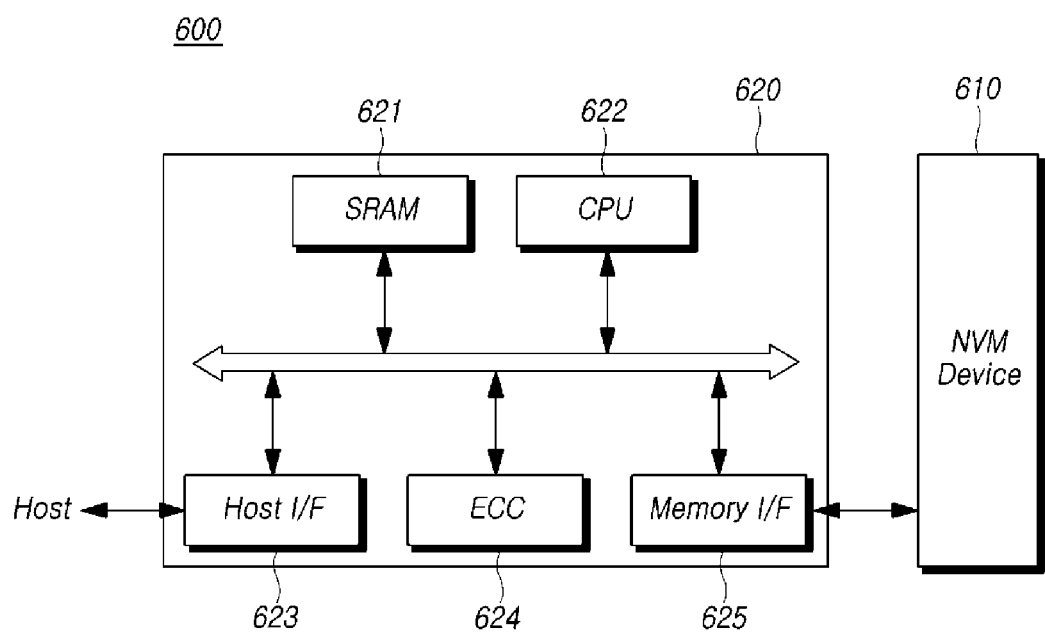
FIG. 17 is a block diagram schematically illustrating an example of a memory system including a semiconductor memory device in accordance with an embodiment.

FIG. 17 is a block diagram schematically illustrating an example of a memory system including a semiconductor memory device in accordance with an embodiment of the disclosure.

Referring to FIG. 17, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 18:
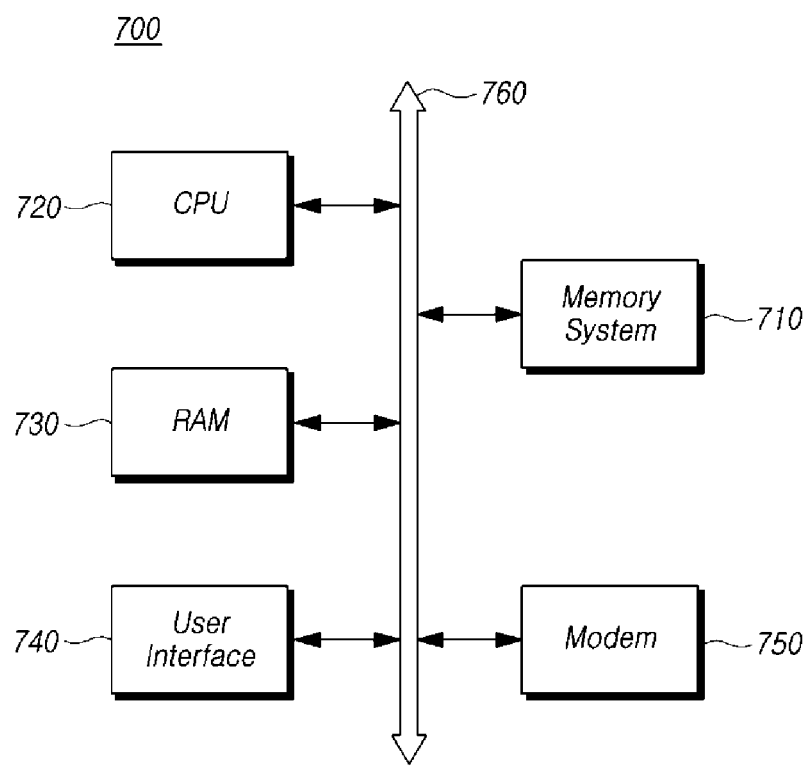
FIG. 18 is a block diagram schematically illustrating an example of a computing system including a semiconductor memory device in accordance with an embodiment.

FIG. 18 is a block diagram schematically illustrating an example of a computing system including a semiconductor memory device in accordance with an embodiment of the disclosure.

Referring to FIG. 18, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted the appended claims and encompass all equivalents falling within the scope of the appended claims.

What is claimed is:

1. A semiconductor memory device comprising:
   a memory chip having a plurality of first pads and a first misalignment detection pattern on a first surface; and a circuit chip having a plurality of second pads and a second misalignment detection pattern on a second surface, and bonded to the first surface of the memory chip such that the second pads are coupled with the first pads, wherein the circuit chip includes a misalignment detection circuit which is coupled between the second misalignment detection pattern and a test pad and outputs a first voltage provided from the first misalignment detection pattern, to the test pad, in the case where a misalignment between the memory chip and the circuit chip exceeds a preset value such that the first misalignment detection pattern and the second misalignment detection pattern are shorted to each other.

2. The semiconductor memory device according to claim 1, wherein the misalignment detection circuit comprises:
a precharge circuit configured to precharge the second misalignment detection pattern with a second voltage different from the first voltage, in response to a test enable signal;
a latch having an input terminal coupled to the second misalignment detection pattern; and
an inverter coupled between an output terminal of the latch and the test pad.

3. The semiconductor memory device according to claim 2, wherein the precharge circuit comprises an NMOS transistor coupled between the second misalignment detection pattern and the second voltage, and
wherein the NMOS transistor is turned on in response to the test enable signal, the first voltage comprises a power supply voltage, and the second voltage comprises a ground voltage.

4. The semiconductor memory device according to claim 3, wherein the first misalignment detection pattern is coupled with a power supply voltage pad selected from among the plurality of first pads.

5. The semiconductor memory device according to claim 2, wherein the precharge circuit comprises a PMOS transistor coupled between the second misalignment detection pattern and the second voltage,
and wherein the PMOS transistor is turned on in response to the test enable signal, the first voltage comprises a ground voltage, and the second voltage comprises a power supply voltage.

6. The semiconductor memory device according to claim 5, wherein the first misalignment detection pattern is coupled with a ground voltage pad among the plurality of first pads.

7. The semiconductor memory device according to claim 1, wherein a first interval between one of the plurality of first pads and the first misalignment detection pattern differs from a second interval between one of the corresponding second pads and the second misalignment detection pattern.

8. The semiconductor memory device according to claim 1, wherein, in the case where no misalignment has occurred, an interval between the first misalignment detection pattern and the second misalignment detection pattern is a third interval, and the preset value has the same size as the third interval.

9. The semiconductor memory device according to claim 8, wherein the third interval is the same as an overlap margin between the first pads and the second pads.

10. The semiconductor memory device according to claim 1, wherein the plurality of the first pads are disposed at a center portion of the first surface, and the first misalignment detection pattern is disposed at an edge of the first surface, and
wherein the plurality of second pads are disposed at a center portion of the second surface of the circuit chip, and the second misalignment detection pattern is disposed at an edge of the second surface.

11. A semiconductor memory device comprising:
a first chip having a first pad and a first misalignment detection pattern on a first surface; and
a second chip having a second pad and a second misalignment detection pattern on a second surface, and bonded to the first surface of the first chip such that the second pad is coupled with the first pad,
wherein the second chip includes a misalignment detection circuit which is coupled between the second misalignment detection pattern and a test pad and outputs a first voltage provided from the first misalignment detection pattern, to the test pad, in the case where a misalignment between the first chip and the second chip exceeds a preset value such that the first misalignment detection pattern and the second misalignment detection pattern are shorted to each other.

12. The semiconductor memory device according to claim 11, wherein the misalignment detection circuit comprises:
a precharge circuit configured to precharge the second misalignment detection pattern with a second voltage different from the first voltage in response to a test enable signal;
a latch having an input terminal which is coupled to the second misalignment detection pattern; and
an inverter coupled between an output terminal of the latch and the test pad.

13. The semiconductor memory device according to claim 12, wherein the precharge circuit comprises an NMOS transistor which is coupled between the second misalignment detection pattern and the second voltage and is turned on in response to the test enable signal, the first voltage comprises a power supply voltage, and the second voltage comprises a ground voltage.

14. The semiconductor memory device according to claim 12, wherein the precharge circuit comprises a PMOS transistor which is coupled between the second misalignment detection pattern and the second voltage and is turned on in response to the test enable signal, the first voltage comprises a ground voltage, and the second voltage comprises a power supply voltage.

15. The semiconductor memory device according to claim 11, wherein an interval between the first pad and the first misalignment detection pattern is a first interval, and an interval between the second pad and the second misalignment detection pattern is a second interval that is different from the first interval.

16. The semiconductor memory device according to claim 11, in the case where no misalignment has occurred, an interval between the first misalignment detection pattern and the second misalignment detection pattern is a third interval, and the preset value is the same as the third interval.

17. The semiconductor memory device according to claim 16, wherein the third interval the same as an overlap margin between the first pad and the second pad.

18. A semiconductor memory device comprising:
a memory chip having a plurality of first pads and a first misalignment detection pattern on a first surface; and a circuit chip having a plurality of second pads and a second misalignment detection pattern on a second surface, wherein the second surface of the circuit chip is bonded to the first surface of the memory chip such that each of the plurality of second pads is coupled with a corresponding one of the plurality of first pads, wherein the circuit chip includes a misalignment detection circuit coupled between the second misalignment detection pattern and a test pad, wherein a first voltage is output to the test pad when a misalignment between the memory chip and the circuit chip exceeds a preset value and the first misalignment detection pattern and the second misalignment detection pattern are shorted to each other.

19. The semiconductor memory device according to claim 18, wherein a first voltage is not output to the test pad when a third interval between the first misalignment detection pattern and the second misalignment detection pattern is the same or less than the preset value.

* * * * *